United States Patent
Iwaki et al.

(10) Patent No.: US 10,812,039 B2
(45) Date of Patent: Oct. 20, 2020

(54) ACOUSTIC WAVE RESONATOR, FILTER, AND MULTIPLEXER

(71) Applicant: TAIYO YUDEN CO., LTD., Tokyo (JP)

(72) Inventors: Masafumi Iwaki, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 198 days.

(21) Appl. No.: 16/002,706

(22) Filed: Jun. 7, 2018

(65) Prior Publication Data

US 2018/0375491 A1  Dec. 27, 2018

(30) Foreign Application Priority Data

Jun. 26, 2017  (JP) ................................. 2017-124227

(51) Int. Cl.
*H03H 9/02* (2006.01)
*H03H 9/72* (2006.01)
(Continued)

(52) U.S. Cl.
CPC .... *H03H 9/02834* (2013.01); *H03H 9/02559* (2013.01); *H03H 9/02574* (2013.01);
(Continued)

(58) Field of Classification Search
CPC ........... H03H 9/02834; H03H 9/02559; H03H 9/02574; H03H 9/02858; H03H 9/02866; H03H 9/02992; H03H 9/14541; H03H 9/14552; H03H 9/25; H03H 9/6483; H03H 9/725
(Continued)

(56) References Cited

U.S. PATENT DOCUMENTS

| | | | |
|---|---|---|---|
| 5,446,330 A | 8/1995 | Eda et al. | 310/313 R |
| 2004/0226162 A1 | 11/2004 | Miura et al. | 29/594 |

(Continued)

FOREIGN PATENT DOCUMENTS

| | | |
|---|---|---|
| JP | 6-326553 A | 11/1994 |
| JP | 2004-343359 A | 12/2004 |

(Continued)

OTHER PUBLICATIONS

Drafts, B., "Acoustic Wave Technology Sensors", IEEE Transactions on Microwave Theory and Techniques, vol. 49, No. 4, Apr. 2001, pp. 795-802. (Year: 2001).*

(Continued)

*Primary Examiner* — Benny T Lee
*Assistant Examiner* — Hafizur Rahman
(74) *Attorney, Agent, or Firm* — Stein IP, LLC

(57) ABSTRACT

An acoustic wave resonator includes: a piezoelectric substrate that is a lithium tantalate substrate or a lithium niobate substrate and has a thickness of 20 μm or less; a support substrate that has an upper surface bonded with a lower surface of the piezoelectric substrate And is a glass substrate mainly composed of silicon oxide; a plurality of electrode fingers that are located on an upper surface of the piezoelectric substrate, excite an acoustic wave, and include a metal film mainly composed of at least one of Cr, Mo, and W.

20 Claims, 11 Drawing Sheets

(51) Int. Cl.
  *H03H 9/25* (2006.01)
  *H03H 9/64* (2006.01)
  *H03H 9/145* (2006.01)

(52) U.S. Cl.
  CPC .... *H03H 9/02858* (2013.01); *H03H 9/02866* (2013.01); *H03H 9/02992* (2013.01); *H03H 9/14541* (2013.01); *H03H 9/14552* (2013.01); *H03H 9/25* (2013.01); *H03H 9/6483* (2013.01); *H03H 9/725* (2013.01)

(58) Field of Classification Search
  USPC .......................................................... 333/133
  See application file for complete search history.

(56) References Cited

U.S. PATENT DOCUMENTS

| | | | |
|---|---|---|---|
| 2005/0077982 A1 | 4/2005 | Funasaka | 333/195 |
| 2009/0261921 A1* | 10/2009 | Moriya | H03H 9/0076 333/25 |
| 2010/0182101 A1 | 7/2010 | Suzuki | 333/193 |
| 2012/0194032 A1 | 8/2012 | Kadota | 310/313 A |
| 2014/0225684 A1* | 8/2014 | Kando | H03H 9/02559 333/195 |
| 2015/0042207 A1 | 2/2015 | Hori et al. | 310/313 R |
| 2015/0328875 A1 | 11/2015 | Hattori et al. | 38/10 |
| 2016/0211829 A1 | 7/2016 | Iwaki et al. | 9/64 |
| 2017/0033765 A1 | 2/2017 | Moriya et al. | |
| 2017/0170808 A1 | 6/2017 | Iwaki et al. | 9/25 |

FOREIGN PATENT DOCUMENTS

| | | |
|---|---|---|
| JP | 2005-65050 A | 3/2005 |
| JP | 2010-251827 A | 11/2010 |
| JP | 2011-254354 A | 12/2011 |
| JP | 2016-136712 A | 7/2016 |
| JP | 2017-112603 A | 6/2017 |
| KR | 10-2005-0021876 A | 3/2005 |
| KR | 10-2011-0083451 A | 7/2011 |
| KR | 10-2017-0015186 A | 2/2017 |
| WO | WO 2011-046117 A1 | 4/2011 |
| WO | WO 2014/129432 A1 | 8/2014 |
| WO | WO 2014/156507 A1 | 10/2014 |

OTHER PUBLICATIONS

Coefficients of Linear Thermal Expansion table of Engineering Toolbox, Engineering Toolbox, 2003 (Year: 2003).*
Bartasyte et al., "Residual stresses and clamped thermal expansion in LiNbO3 and LiTaO3 thin films", Applied Physics Letter 101, 2012, pp. 122902-1-122902-5 (Year: 2012).*
Caroll et al.,"Doe Regulatory Reform Initiative Vitrified Mixed Waste" published in 1997 proceedings of the Air and Waste Management Association's 90. annual meeting and exhibition. (Year: 1997).*
Notification of Reason for Refusal dated May 30, 2019, issued by the Korean Intellectual Property Office in corresponding application KR 10-2018-0071339.
Notification of Reason for Refusal dated Oct. 11, 2019, issued by the Korean Intellectual Property Office in corresponding Korean Application No. 10-2018-0071339.
Korean Notice of Final Rejection dated Mar. 10, 2020, in counterpart Korean Patent Application No. 10-2018-0071339.

* cited by examiner

CTE10a, CTE14, CTE30 < CTE10b

CTE10a, CTE14, CTE30 < CTE10b

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2017-124227, filed on Jun. 26, 2017, the entire contents of which are incorporated herein by reference.

FIELD

A certain aspect of the present invention relates to an acoustic wave resonator, a filter, and a multiplexer.

BACKGROUND

In high frequency communication systems typified by mobile phones, high-frequency filters have been used to remove unnecessary signals in other than the frequency band used for communication. Used for the high-frequency filters are acoustic wave resonators such as surface acoustic wave (SAW) resonators. In the SAW resonator, electrode fingers formed of a metal film are formed on a piezoelectric substrate such as a lithium tantalate ($LiTaO_3$) substrate or a lithium niobate ($LiNbO_3$) substrate. To reduce the change in frequency due to the thermal expansion of the piezoelectric substrate and the variation of the elastic modulus of the piezoelectric substrate with temperature, it has been known to bond the piezoelectric substrate with a support substrate having a linear thermal expansion coefficient less than that of the piezoelectric substrate as disclosed in, for example, Japanese Patent Application Publication Nos. 2004-343359, 2005-65050, H06-326553, and 2016-136712, and International Publication Nos. 2014/129432, 2014/156507, and 2011/046117.

SUMMARY OF THE INVENTION

According to a first aspect of the present invention, there is provided an acoustic wave resonator including: a piezoelectric substrate that is a lithium tantalate substrate or a lithium niobate substrate and has a thickness of 20 μm or less; a support substrate that has an upper surface bonded with a lower surface of the piezoelectric substrate and is a glass substrate mainly composed of silicon oxide; a plurality of electrode fingers that are located on an upper surface of the piezoelectric substrate, excite an acoustic wave, and include a metal film mainly composed of at least one of Cr, Mo, and W.

According to a second aspect of the present invention, there is provided an acoustic wave resonator including: a piezoelectric substrate that is a lithium tantalate substrate or a lithium niobate substrate and has a thickness of 20 μm or less; a support substrate that has an upper surface bonded with a lower surface of the piezoelectric substrate and is a sapphire substrate or a crystallized silicon oxide substrate; and a plurality of electrode fingers that are located on an upper surface of the piezoelectric substrate, excite an acoustic wave, and include a metal film mainly composed of at least one of Ru, Rh, Pt, and Ti.

According to a third aspect of the present invention, there is provided an acoustic wave resonator including: a piezoelectric substrate that is a lithium tantalate substrate or a lithium niobate substrate and has a thickness of 20 μm or less; a support substrate that has an upper surface bonded with a lower surface of the piezoelectric substrate and has a linear thermal expansion coefficient less than a linear thermal expansion coefficient in an X-axis orientation of the piezoelectric substrate; and a plurality of electrode fingers that are located on an upper surface of the piezoelectric substrate, are arranged in the X-axis orientation, excite an acoustic wave, and include a metal film having a thickness equal to or greater than 0.1 times a wavelength of the acoustic wave and having a linear thermal expansion coefficient less than the linear thermal expansion coefficient in the X-axis orientation of the piezoelectric substrate.

According to a fourth aspect of the present invention, there is provided an acoustic wave resonator including: a piezoelectric substrate; a support substrate that has an upper surface bonded with a lower surface of the piezoelectric substrate and has a linear thermal expansion coefficient less than a linear thermal expansion coefficient of the piezoelectric substrate; a pair of comb-shaped electrodes that is formed on the piezoelectric substrate and includes a first metal film with a linear thermal expansion coefficient less than the linear thermal expansion coefficient of the piezoelectric substrate, each of the pair of comb-shaped electrodes having a plurality of electrode fingers exciting an acoustic wave and a bus bar connecting the plurality of electrode fingers; and an additional film that is located on an upper surface of the piezoelectric substrate in a gap region, is not connected to the pair of comb-shaped electrodes, and includes a second metal film having a linear thermal expansion coefficient less than the linear thermal expansion coefficient of the piezoelectric substrate, the gap region being located between the plurality of electrode fingers of one of the pair of comb-shaped electrodes and the bus bar of the other of the pair of comb-shaped electrodes.

According to a fifth aspect of the present invention, there is provided a filter including: any one of the above acoustic wave resonators.

According to a sixth aspect of the present invention, there is provided a multiplexer including the above filter.

DETAILED DESCRIPTION

By attaching a piezoelectric substrate to a support substrate having a less linear thermal expansion coefficient, the change in frequency due to temperature change is reduced. However, deterioration of the electrode finger such as peeling of the electrode finger from the piezoelectric substrate may occur.

Hereinafter, a description will be given of embodiments with reference to the accompanying drawings.

First Embodiment

Figure 1A:
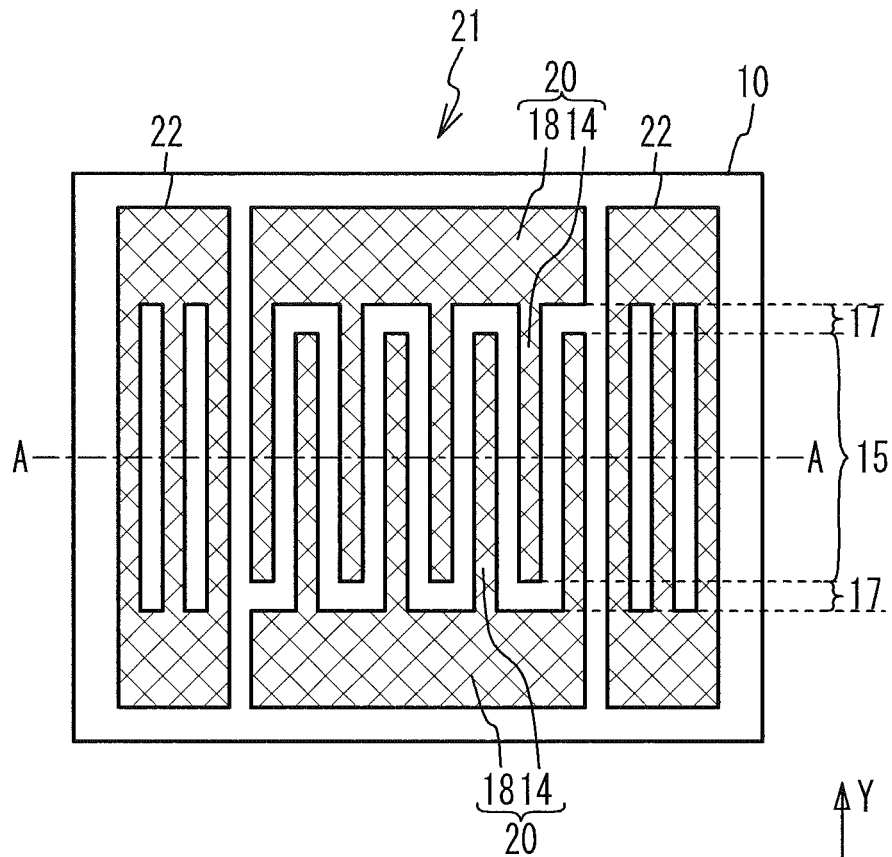
FIG. 1A is a plan view of an acoustic wave resonator in accordance with a first embodiment.
Figure 1B:
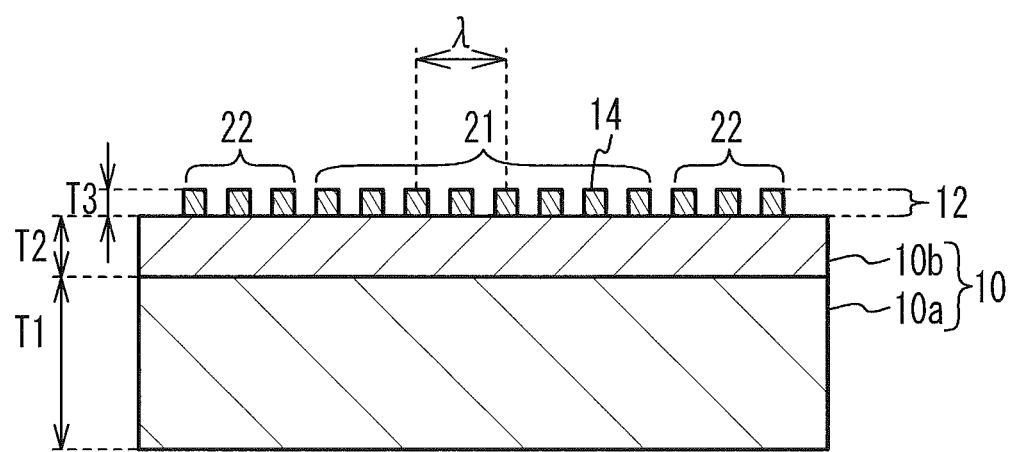
FIG. 1B is a cross-sectional view taken along line A-A in FIG. 1A.

FIG. 1A is a plan view of an acoustic wave resonator in accordance with a first embodiment, and FIG. 1B is a cross-sectional view taken along line A-A in FIG. 1A. As illustrated in FIG. 1A and FIG. 1B, a substrate 10 has a support substrate 10a and a piezoelectric substrate 10b. The lower surface of the piezoelectric substrate 10b is bonded with the upper surface of the support substrate 10a. The piezoelectric substrate 10b may be directly bonded on the support substrate 10a through an amorphous layer having a thickness of, for example, several nanometers or less. Alternatively, the piezoelectric substrate 10b may be bonded on the support substrate 10a through an adhesive agent.

An IDT 21 and reflectors 22 are formed on the upper surface of the piezoelectric substrate 10b. The IDT 21 and the reflectors 22 are formed of a metal film 12 formed on the piezoelectric substrate 10b. The IDT 21 includes a pair of comb-shaped electrodes 20 facing each other. The comb-shaped electrode 20 includes a plurality of electrode fingers 14 and a bus bar 18 to which the electrode fingers 14 are connected. The electrode fingers 14 form a grating electrode. The pair of the comb-shaped electrodes 20 is arranged so as to face each other so that the electrode fingers 14 of one of the comb-shaped electrodes 20 and the electrode fingers 14 of the other are substantially alternately arranged. The thicknesses of the support substrate 10a, the piezoelectric substrate 10b, and the metal film 12 are represented by T1, T2, and T3, respectively.

The region where the electrode fingers 14 of the pair of the comb-shaped electrodes 20 overlap is an overlap region 15. In the overlap region 15, the acoustic wave excited by the electrode fingers 14 mainly propagates in the arrangement direction of the electrode fingers 14. The pitch of the electrode fingers 14 of one comb-shaped electrode 20 corresponds to the wavelength λ of the acoustic wave. That is, the value calculated by dividing the width in the X direction of the IDT 21 by the number of pairs of the electrode fingers 14 corresponds to the wavelength of the acoustic wave. On the other hand, the region between the tips of the electrode fingers 14 of one of the comb-shaped electrodes 20 and the bus bar 18 of the other of the comb-shaped electrodes 20 is a gap region 17. When dummy electrode fingers are provided, the gap region is the region between the tips of the electrode fingers and the tips of the dummy electrode fingers. The propagation direction of the acoustic wave is defined as the X direction, the direction perpendicular to the propagation direction is defined as the Y direction, and the normal direction of the substrate 10 is defined as the Z direction. The X direction and the Y direction do not necessarily correspond to the X-axis orientation and the Y-axis orientation of the crystal orientation of the piezoelectric substrate 10b.

The linear thermal expansion coefficient of the material used for the support substrate 10a will be presented.

Sapphire, crystal (for example, ST cut, AT cut): approximately 8 ppm/° C.

Quartz, low thermal expansion glass: approximately 0.5 ppm/° C.

Crystal is crystallized silicon oxide ($SiO_2$). Thus, a crystal substrate is referred to as a crystallized silicon oxide substrate. Quartz is quartz glass. Low thermal expansion glass is glass containing 50 wt. % or greater of silicon oxide and having a linear thermal expansion coefficient less than that of the crystal substrate. A quartz substrate and a low thermal expansion glass substrate are referred to as a glass substrate mainly composed of silicon oxide. At least part of glass is non-crystalline. Sapphire is crystallized aluminum oxide ($Al_2O_3$).

The linear thermal expansion coefficient of the material used for the piezoelectric substrate 10b will be presented.

Lithium tantalate (X-axis orientation): approximately 17 ppm/° C.

Lithium niobate (X-axis orientation): approximately 16 ppm/° C.

Used as lithium tantalate and lithium niobate is a rotated Y-cut X-propagation substrate. In the rotated Y-cut X-propagation substrate, the direction in which the electrode fingers 14 are arranged (i.e., the direction in which the acoustic wave propagates) corresponds to the X-axis orientation (the X-axis orientation of the crystal orientation).

Simulated was the linear thermal expansion coefficient in the X direction on the upper surface of the piezoelectric substrate 10b when the above-described support substrate 10a and the above-described piezoelectric substrate 10b were used. The piezoelectric substrate 10b was assumed to be a 42° rotated Y-cut X-propagation lithium tantalate substrate. The support substrate 10a was assumed to be made of sapphire or crystal (the linear thermal expansion coefficient is approximately 8 ppm/° C.) and quartz or low thermal expansion glass (the linear thermal expansion coefficient is approximately 0.5 ppm/° C.). The thickness T1 of the support substrate 10a was assumed to be 250 µm.

The simulation was conducted by the finite element method. The thermal expansion coefficient in the X direction on the upper surface of the piezoelectric substrate 10b was calculated from the deformation amount in the X direction of the upper surface of the piezoelectric substrate 10b when the temperature was increased by 10° C. from room temperature (25° C.). The calculated thermal expansion coefficient is simply referred to as a thermal expansion coefficient to distinguish from the linear thermal expansion coefficient of bulk. Since the linear thermal expansion coefficient of the lithium niobate substrate is nearly equal to that of the lithium tantalate substrate, the simulation results can also be applied to the lithium niobate substrate.

Figure 2:
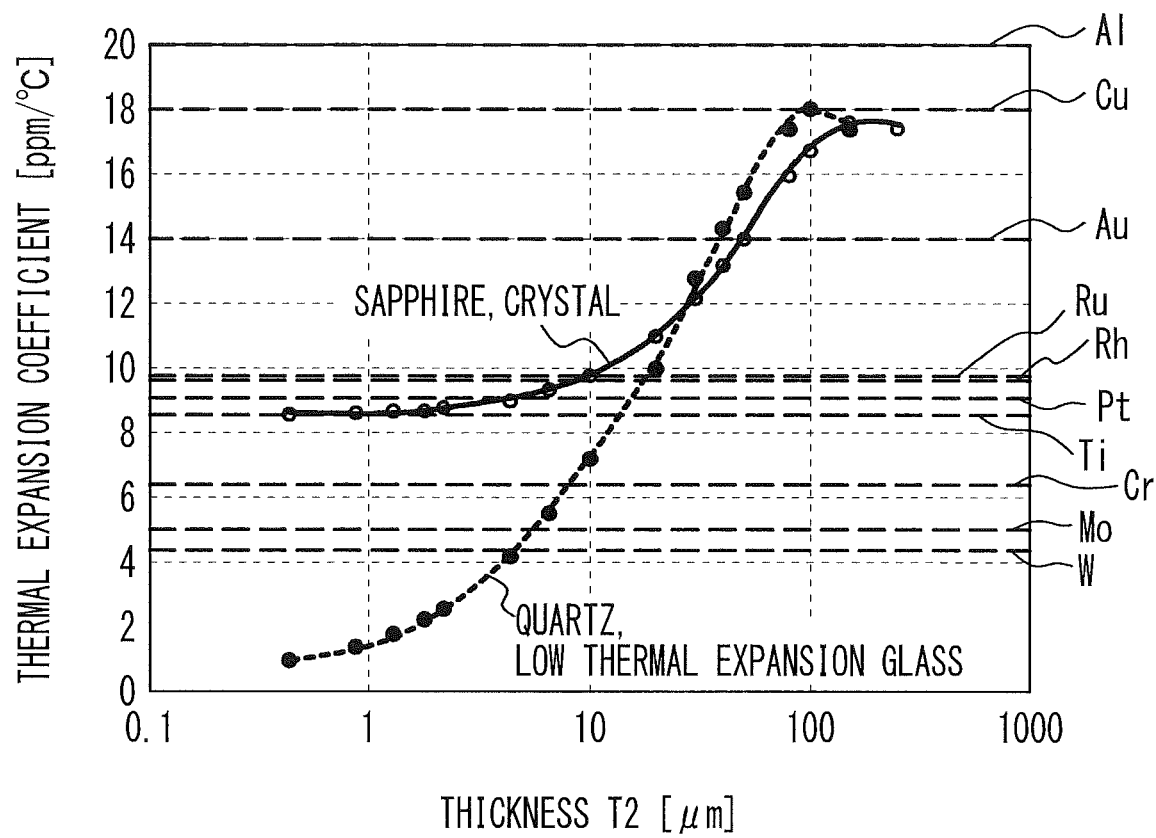
FIG. 2 is a graph of a thermal expansion coefficient on the upper surface of a piezoelectric substrate versus a thickness T2.

FIG. 2 is a graph of the thermal expansion coefficient on the upper surface of the piezoelectric substrate versus the thickness T2. As illustrated in FIG. 2, when the thickness T2 of the piezoelectric substrate 10b is decreased to 100 µm or less, the thermal expansion coefficient starts to decrease. For sapphire and crystal, when T2 is 20 µm or less, the thermal expansion coefficient is 12 ppm/° C. or less, and when T2 is 10 µm or less, the thermal expansion coefficient is 10 ppm/° C. or less. When T2 further decreases, the thermal expansion coefficient converges at approximately 8.5 ppm/° C. When the thickness T2 is 20 µm, 4.4 µm, and 2.2 µm, the thermal expansion coefficient is respectively 11.0 ppm/° C., 9.0 ppm/° C., and 8.8 ppm/° C. For quartz and low thermal expansion glass, when T2 is 10 µm or less, the thermal expansion coefficient is 8 ppm/° C. or less, and when T2 further decreases, the thermal expansion coefficient converges at approximately 1 ppm/° C. When the thickness T2 is 20 µm, 4.4 µm, And 2.2 µm, the thermal expansion coefficient is respectively 10.0 ppm/° C., 4.2 ppm/° C., and 2.58 ppm/° C.

Figure 3A:
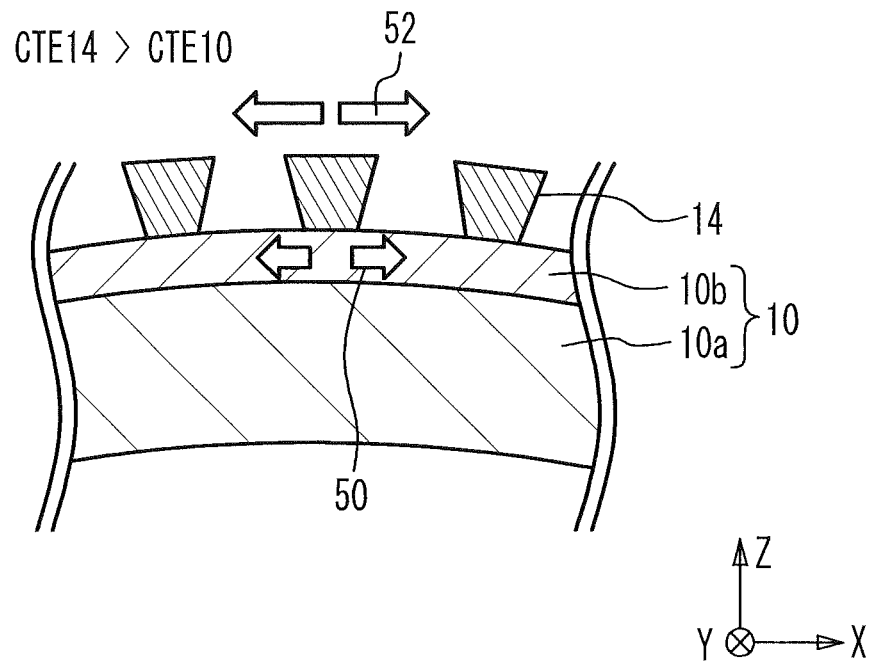
FIG. 3A and FIG. 3B are cross-sectional views of the acoustic wave resonator.
Figure 3B:
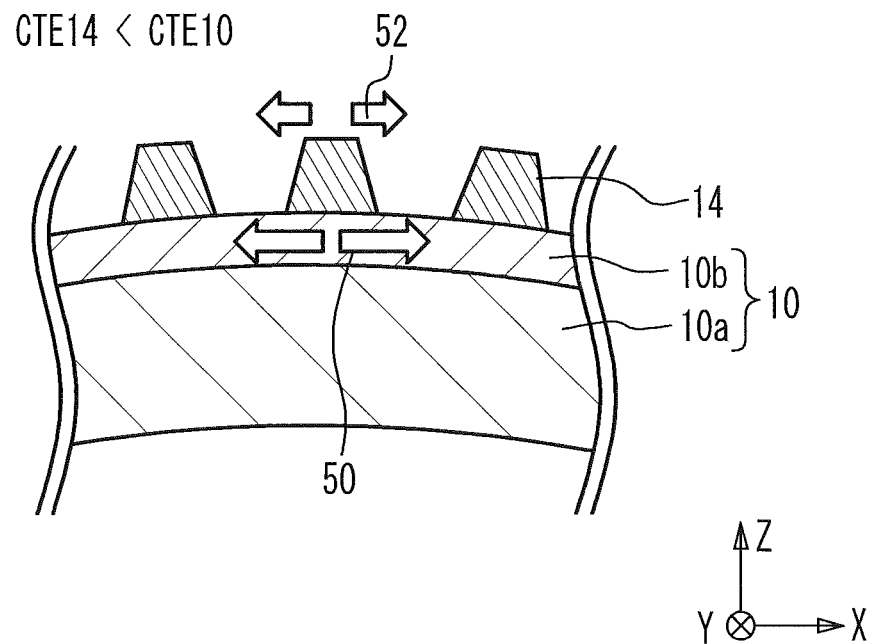

FIG. 3A and FIG. 3B are cross-sectional views of the acoustic wave resonator. As illustrated in FIG. 3A, when the linear thermal expansion coefficient CTE14 of the electrode finger 14 is greater than the thermal expansion coefficient CTE10 of the upper surface of the piezoelectric substrate 10b and the temperature increases, expansion 52 of the electrode finger 14 is greater than expansion 50 of the upper surface of the piezoelectric substrate 10b. As illustrated in FIG. 3B, when the linear thermal expansion coefficient CTE14 of the electrode finger 14 is less than the thermal expansion coefficient CTE10 of the upper surface of the piezoelectric substrate 10b and the temperature increases, the expansion 52 of the electrode finger 14 is less than the expansion 50 of the upper surface of the piezoelectric substrate 10b. This causes the electrode finger 14 to be easily peeled from the piezoelectric substrate 10b. For example, if a temperature cycle is repeated over a long period, peeling of the electrode finger 14 easily occurs. As described above, the electrode finger 14 deteriorates. When the thickness T3 of the electrode finger 14 is large, the thermal stress applied to the electrode finger 14 is large. Thus, the electrode finger 14 is easily peeled.

Table 1 lists the linear thermal expansion coefficient of each metal. In FIG. 2, the linear thermal expansion coefficient of each metal is indicated by a horizontal dashed line.

TABLE 1

| Metal | Al | Cu | Au | Ru | Rh | Pt | Ti | Cr | Mo | W |
|---|---|---|---|---|---|---|---|---|---|---|
| Linear thermal expansion coefficient [ppm/° C.] | 20 | 18 | 14 | 9.7 | 9.6 | 9.0 | 8.5 | 6.2 | 4.9 | 4.3 |

As presented in FIG. 2 and Table 1, the linear thermal expansion coefficients of aluminum (Al) and copper (Cu), which are often used as the electrode finger 14, are respectively 20 ppm/° C. and 18 ppm/° C., which are nearly equal to or slightly greater than those of the lithium tantalate substrate and the lithium niobate substrate. Accordingly, as the thermal expansion coefficient CTE10 of the upper surface of the piezoelectric substrate 10b decreases, the thermal stress applied to the electrode finger 14 increases as illustrated in FIG. 3A. This causes the electrode finger 14 to be easily peeled.

As presented in FIG. 2 and Table 1, the linear thermal expansion coefficient of gold (Au) is 14 ppm/° C., which is less than those of the lithium tantalate substrate and the lithium niobate substrate. The linear thermal expansion coefficients of ruthenium (Ru), rhodium (Rh), platinum (Pt), and titanium (Ti) are respectively 9.7 ppm/° C., 9.6 ppm/° C., 9.0 ppm/° C., and 8.5 ppm/° C., which are in the range of 8 ppm/° C. to 10 ppm/° C. The linear thermal expansion coefficients of chrome (Cr), molybdenum (Mo), and tungsten (W) are respectively 6.2 ppm/° C., 4.9 ppm/° C., and 4.3 ppm/° C., which are in the range of 4 ppm/° C. to 7 ppm/° C.

Figure 4A:
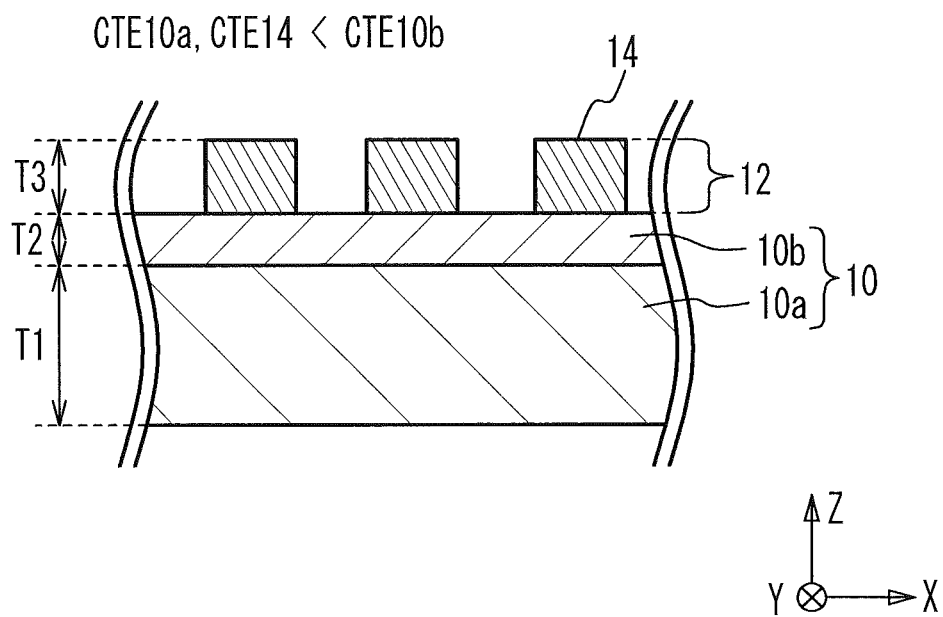
FIG. 4A and FIG. 4B are cross-sectional views of the acoustic wave resonator in accordance with the first embodiment.
Figure 4B:
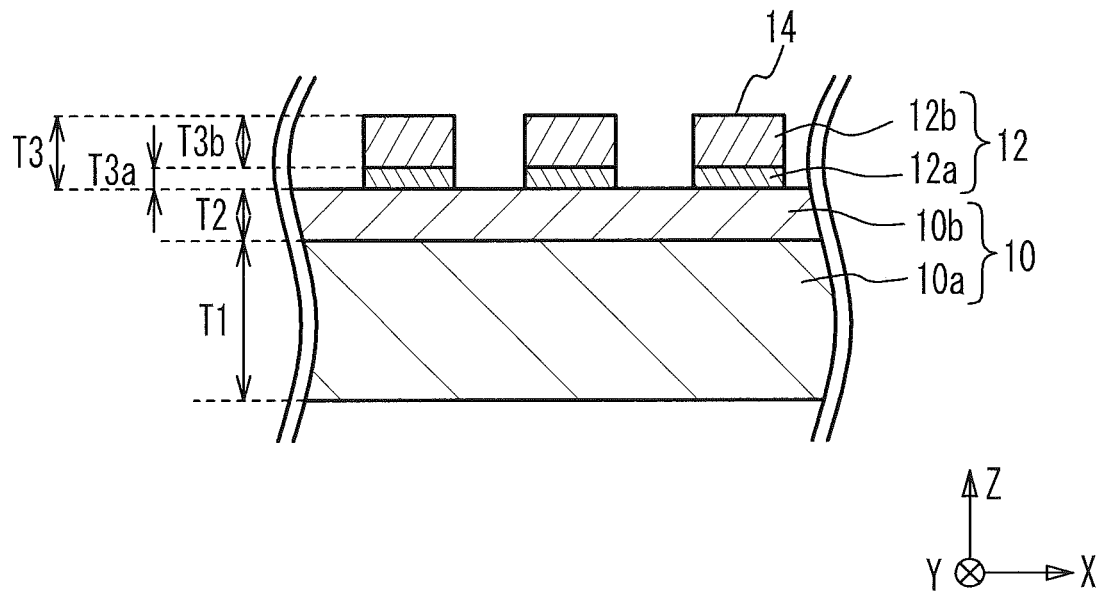

FIG. 4A and FIG. 4B are cross-sectional views of the acoustic wave resonator in accordance with the first embodiment. As illustrated in FIG. 4A, the piezoelectric substrate 10b is a lithium tantalate substrate or a lithium niobate substrate, and has a thickness T2 of 20 µm or less. The support substrate 10a has an upper surface bonded with the lower surface of the piezoelectric substrate 10b, and has a linear thermal expansion coefficient CTE10a less than the linear thermal expansion coefficient CTE10b in the X-axis orientation of the piezoelectric substrate 10b. The electrode finger 14 includes the metal film 12 having a thickness T3 equal to or greater than 0.1 times the wavelength λ of the acoustic wave and having a linear thermal expansion coefficient CTE14 less than the linear thermal expansion coefficient CTE10b in the X-axis orientation of the piezoelectric substrate 10b. Thus, even when the temperature increases, the expansion of the upper surface of the piezoelectric substrate 10b and the expansion of the electrode finger 14 are in the same range. Therefore, peeling of the electrode finger 14 from the piezoelectric substrate 10b is inhibited. For example, the electrode finger 14 is inhibited from being peeled by a temperature cycle over a long period. As described above, deterioration of the electrode finger 14 is reduced.

As illustrated in FIG. 4B, the metal film 12 may include a metal film 12a on the piezoelectric substrate 10b and a metal film 12b on the metal film 12a. The thicknesses of the metal films 12a and 12b are indicated by T3a and T3b, respectively. When the metal film 12 is a multilayered film having two or more layers, it is sufficient if at least one of the linear thermal expansion coefficient CTE12a of the metal film 12a and the linear thermal expansion coefficient CTE12b of the metal film 12b is less than CTE10b. The total thickness, which is the sum of the thickness T3a and/or T3b of the metal film 12a and/or 12b having the linear thermal expansion coefficient CTE12a and/or CTE12b less than CTE10b, is preferably equal to or greater than 0.1 times the wavelength λ, of the acoustic wave.

When the electrode finger 14 is thick, the thermal stress is easily applied to the electrode finger 14, and the electrode finger 14 is thus easily peeled. Therefore, the thickness T3 in FIG. 4A and FIG. 4B is preferably equal to or less than 1 time, more preferably equal to or less than 0.5 times the thickness T2. Since the acoustic wave is excited on the piezoelectric substrate 10b, the thickness T3 of the electrode finger 14 is preferably equal to or greater than 0.1 times, more preferably equal to or greater than 0.11 times the wavelength λ, of the acoustic wave. In addition, the thickness T3 is preferably equal to or less than 0.2 times, more preferably equal to or less than 0.15 times the wavelength λ.

The metal film 12a being in contact with the piezoelectric substrate 10b is applied with the greatest thermal stress. Thus, the linear thermal expansion coefficient CTE12a of the metal film 12a is preferably less than CTE10b. In addition, the metal film 12a and/or 12b with a linear thermal expansion coefficient less than the linear thermal expansion coefficient of the piezoelectric substrate 10b preferably has a thickness equal to or greater than a half of the thickness T3 of the metal film 12, more preferably has a thickness equal to or greater than two thirds of the thickness T3 of the metal film 12.

As illustrated in FIG. 2, when the support substrate 10a is a sapphire substrate, a crystal substrate, a quartz substrate, or a low thermal expansion glass substrate, the metal film 12 or the metal film 12a and/or 12b is configured to have a linear thermal expansion coefficient of 12 ppm/° C. or less. This configuration reduces the difference between the linear thermal expansion coefficient of the metal film 12 or the metal film 12a and/or 12b and the thermal expansion coefficient of the upper surface of the piezoelectric substrate 10b. The metal film 12 or the metal film 12a and/or 12b more preferably has a linear thermal expansion coefficient of 10 ppm/° C. or less.

When the support substrate 10a is a sapphire substrate, a crystal substrate, a quartz substrate, or a low thermal expansion glass substrate, the metal film 12 or the metal film 12a and/or 12b is configured to be a film mainly composed of at least one of Ru, Rh, Pt, Ti, Cr, Mo, and W. This configuration reduces the difference between the linear thermal expansion coefficient of the metal film 12 or the metal film 12a and/or 12b and the thermal expansion coefficient of the upper surface of the piezoelectric substrate 10b. The term "mainly composed of" means that the metal film 12 or the metal film 12a and/or 12b contains the subject element to the extent that the advantage of the first embodiment is achieved, and, for example, the metal film 12 preferably contains 50 atomic % or greater of the subject element, more preferably 80 atomic % or greater of the subject element. The thickness T2 is preferably 15 μm or less, more preferably 10 μm or less, and is preferably 1 μm or greater, more preferably 2 μm or greater.

As illustrated in FIG. 2, when the support substrate 10a is a sapphire substrate or a crystal substrate, the metal film 12 or the metal film 12a and/or 12b is preferably a film mainly composed of at least one of Ru, Rh, Pt, and Ti. This configuration further reduces the difference between the linear thermal expansion coefficient of the metal film 12 or the metal film 12a and/or 12b and the thermal expansion coefficient of the upper surface of the piezoelectric substrate 10b.

When the support substrate 10a is a quartz substrate or a low thermal expansion glass substrate, the metal film 12 or the metal film 12a and/or 12b is preferably a film mainly composed of at least one of Cr, Mo, and W. This configuration further reduces the difference between the linear thermal expansion coefficient of the metal film 12 or the metal film 12a and/or 12b and the thermal expansion coefficient of the upper surface of the piezoelectric substrate 10b.

Second Embodiment

Figure 5:
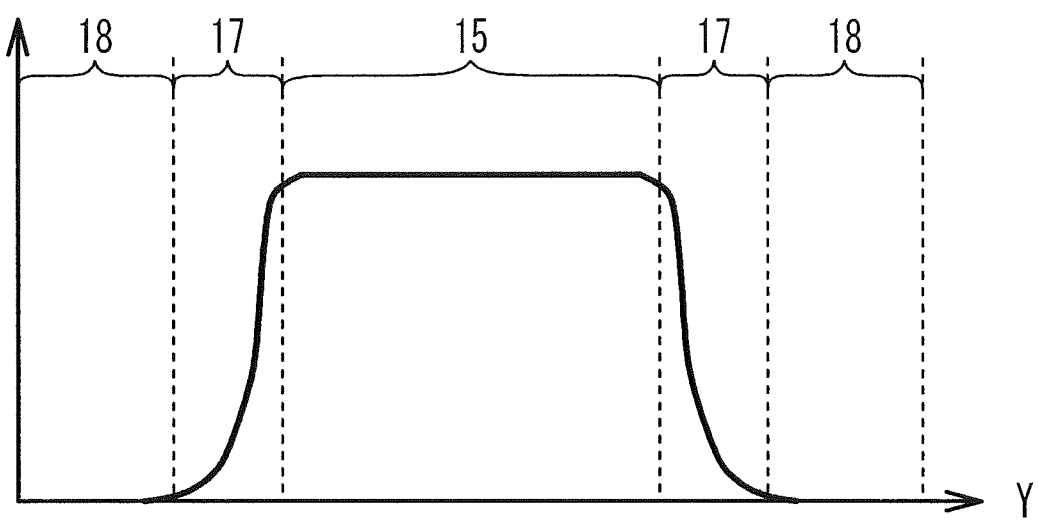
FIG. 5 illustrates a displacement of an acoustic wave in a Y direction.

FIG. 5 illustrates the displacement of the acoustic wave in the Y direction. As illustrated in FIG. 5, the displacement of the acoustic wave is large in the overlap region 15 and flat in the overlap region 15. The displacement is small and substantially flat in the bus bar 18. The displacement rapidly changes in the gap region 17. Thus, the stress associated with the displacement of the acoustic wave is applied to the electrode finger 14 in the gap region 17 most. In addition, the gap region 17 has a lower proportion of the electrode fingers 14 than the overlap region 15. Thus, stress is easily applied to the electrode finger 14 in the gap region 17, and the gap region 17 tends to be a starting point of peeling of the electrode finger 14.

Figure 6A:
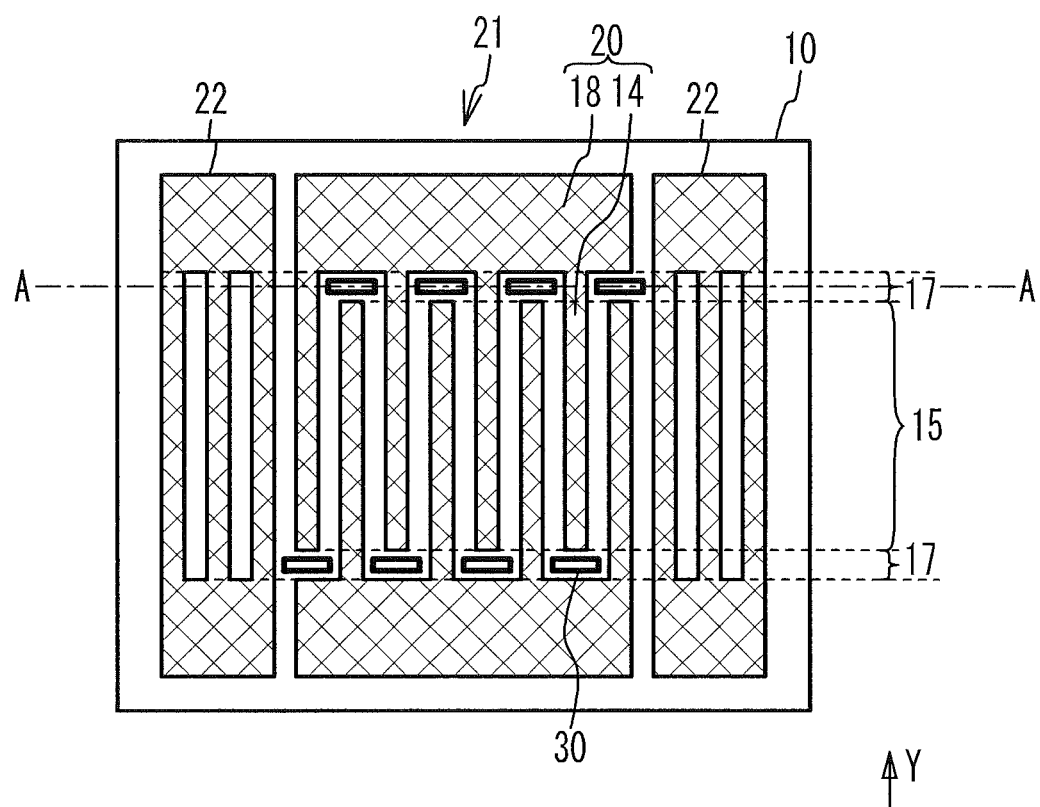
FIG. 6A is a plan view of an acoustic wave resonator in accordance with a second embodiment.
Figure 6B:
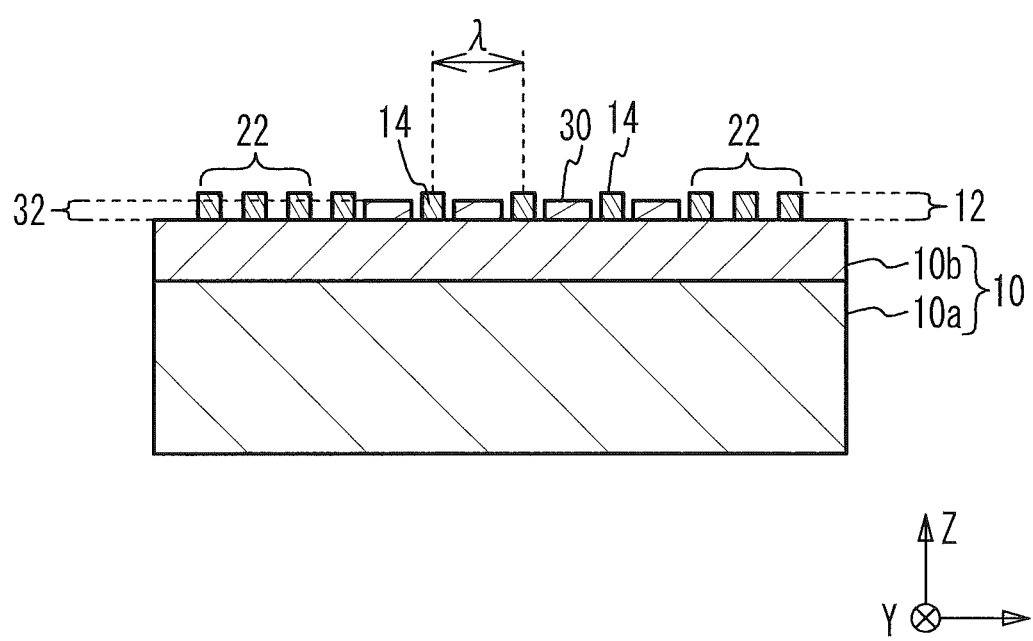
FIG. 6B is a cross-sectional view taken along line A-A in FIG. 6A and is a cross-sectional view of a gap region.

FIG. 6A is a plan view of an acoustic wave resonator in accordance with the second embodiment, and FIG. 6B is a cross-sectional view taken along line A-A in FIG. 6A and is a cross-sectional view of the gap region. As illustrated in FIG. 6A and FIG. 6B, in the gap region 17, an additional film 30 is located on the piezoelectric substrate 10b between the electrode fingers 14. The additional film 30 includes a metal film 32 having a linear thermal expansion coefficient CTE30 less than the linear thermal expansion coefficient CTE10b in the X-axis orientation of the piezoelectric substrate 10b. The additional film 30 is not in contact with the electrode fingers 14 or the bus bar 18. Other structures are the same as those illustrated in FIG. 1A and FIG. 1B, and the description thereof is thus omitted.

First Variation of the Second Embodiment

Figure 7A:
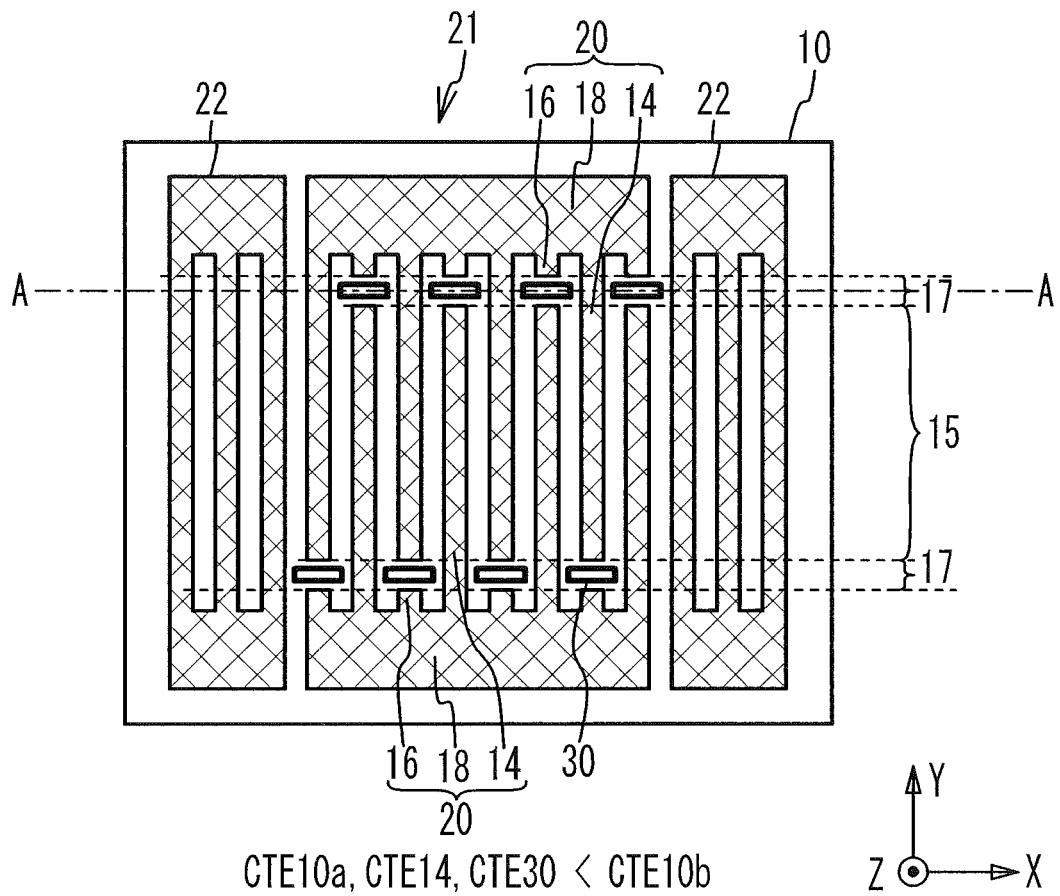
FIG. 7A is a plan view of an acoustic wave resonator in accordance with a first variation of the second embodiment.
Figure 7B:
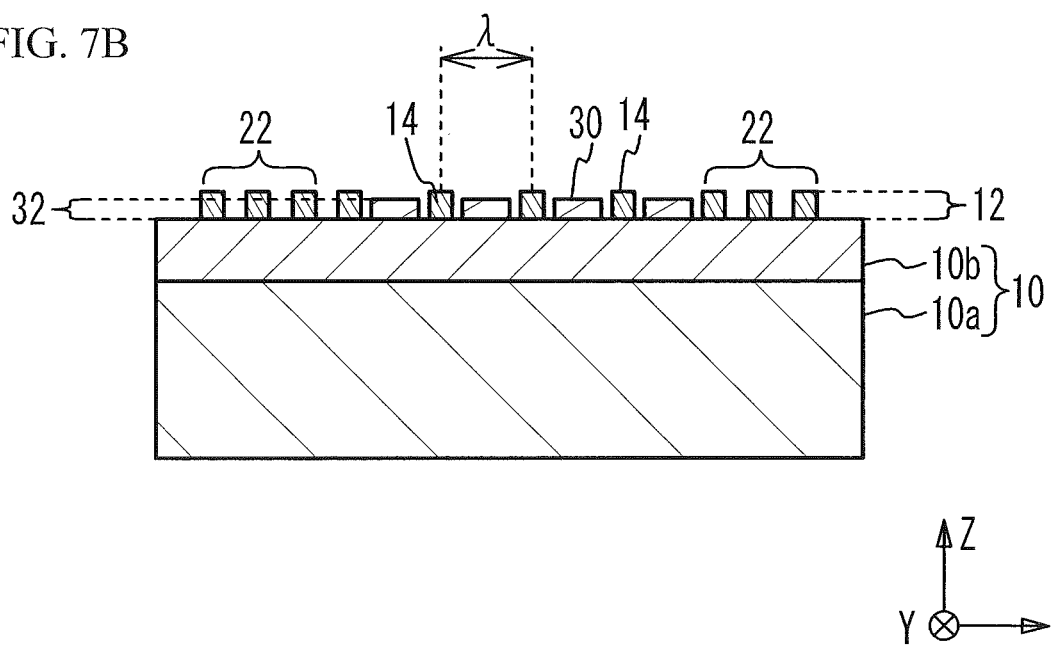
FIG. 7B is a cross-sectional view taken along line A-A in FIG. 7A and is a cross-sectional view of the gap region.

FIG. 7A is a plan view of an acoustic wave resonator in accordance with a first variation of the second embodiment, and FIG. 7B is a cross-sectional view taken along line A-A in FIG. 7A and is a cross-sectional view of the gap region. As illustrated in FIG. 7A and FIG. 7B, each of the pair of the comb-shaped electrodes 20 includes a plurality of the electrode fingers 14, a plurality of dummy electrode fingers 16, and the bus bar 18. The electrode fingers 14 and the dummy electrode fingers 16 are connected to the bus bar 18. The dummy electrode fingers 16 of one of the comb-shaped electrodes 20 face the electrode fingers 14 of the other of the comb-shaped electrodes 20 in the Y direction. The region between the electrode fingers 14 and the dummy electrode fingers 16 is the gap region 17. The additional film 30 is located in the gap region 17. Other structures are the same as those of the second embodiment, and the description thereof is thus omitted.

In the second embodiment and the first variation thereof, the support substrate 10a has an upper surface bonded with the lower surface of the piezoelectric substrate 10b and has a linear thermal expansion coefficient CTE10a less than the linear thermal expansion coefficient CTE10b of the piezoelectric substrate 10b. The pair of the comb-shaped electrodes 20 includes the metal film 12 (a first metal film) having a linear thermal expansion coefficient less than the linear thermal expansion coefficient CTE10b of the piezoelectric substrate 10b. The additional film 30 is located on the upper surface of the piezoelectric substrate 10b in the gap region 17, which is located between the electrode fingers 14 of one of the comb-shaped electrodes 20 and the bus bar 18 of the other of the comb-shaped electrodes 20, and is not connected to the pair of the comb-shaped electrodes 20. The additional film 30 includes the metal film 32 (a second metal film) having a linear thermal expansion coefficient CTE30 less than the linear thermal expansion coefficient CTE10b of the piezoelectric substrate 10b. This configuration makes the area occupied by the electrode fingers 14 and the additional film 30 in the gap region 17 nearly equal to the area occupied by the electrode fingers 14 in the overlap region 15. Thus, the stress applied to the electrode finger 14 in the gap region 17 is reduced. Therefore, the gap region 17 is inhibited from being a starting point of peeling of the electrode finger 14.

Additionally, the piezoelectric substrate 10b is a lithium tantalate substrate with a film thickness of 20 μm or less or a lithium niobate substrate with a film thickness of 20 μm or less. The support substrate 10a is a crystal substrate, a sapphire substrate, a quartz substrate, or a low thermal expansion glass substrate. In this configuration, the metal films 12 and 32 are configured to respectively have linear thermal expansion coefficients CTE14 and CTE30 of 12 ppm/° C. or less. This configuration reduces the differences between the thermal expansion coefficient of the upper surface of the piezoelectric substrate 10b and the linear thermal expansion coefficients of the electrode finger 14 and the additional film 30 as illustrated in FIG. 2. Thus, peeling of the electrode finger 14 is inhibited.

Furthermore, as illustrated in FIG. 2, when the support substrate 10a is a crystal substrate or a sapphire substrate, the metal films 12 and 32 are preferably mainly composed of at least one of Ru, Rh, Pt, and Ti. When the support substrate 10a is a quartz substrate or a low thermal expansion glass substrate, the metal films 12 and 32 are preferably mainly composed of at least one of Cr, Mo, and W.

The metal films 12 and 32 may be made of different materials and have different thicknesses. Additionally, the electrode finger 14 and the additional film 30 may be made of different materials and have different thicknesses. However, the metal films 12 and 32 are preferably made of the same material. For example, the material and the thickness of the additional film 30 are preferably practically the same as the material and the thickness of the electrode finger 14 to the extent of manufacturing errors. This configuration inhibits the gap region 17 from being a starting point of peeling of the electrode finger 14.

In the second embodiment and the variation thereof, as with the metal film 12 in FIG. 4B, the metal film 32 may be a multilayered film of a plurality of metal films. It is sufficient if at least one of the plurality of metal films has a linear thermal expansion coefficient less than the linear thermal expansion coefficient of the piezoelectric substrate 10b.

Third Embodiment

Figure 8A:
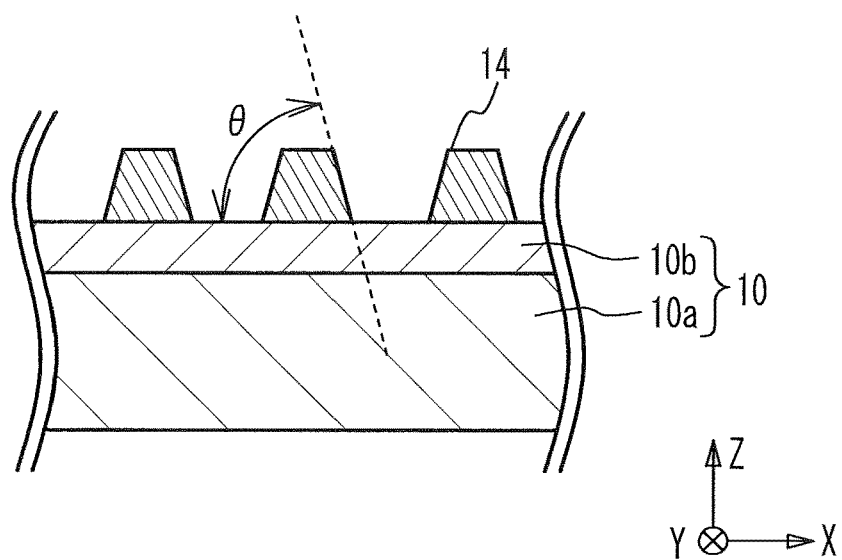
FIG. 8A through FIG. 8C are cross-sectional views of an acoustic wave resonator in accordance with a third embodiment.
Figure 8B:
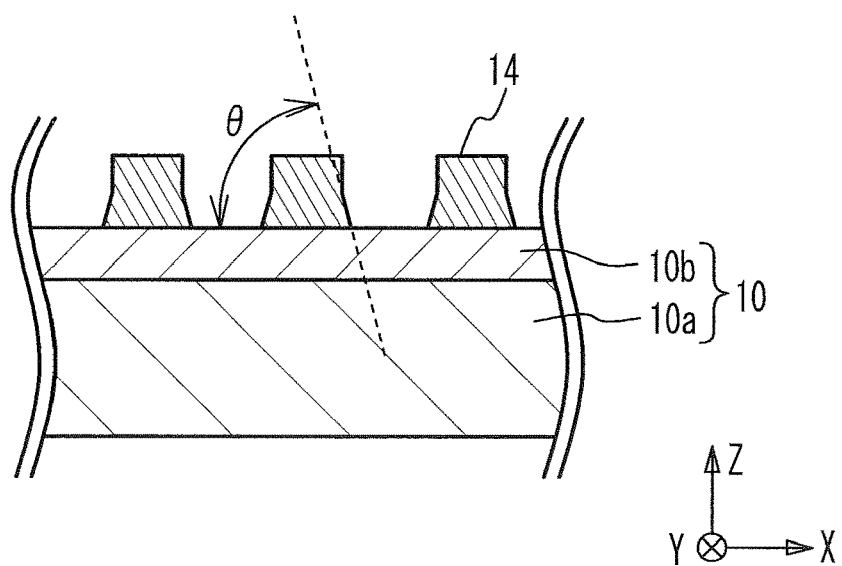
Figure 8C:
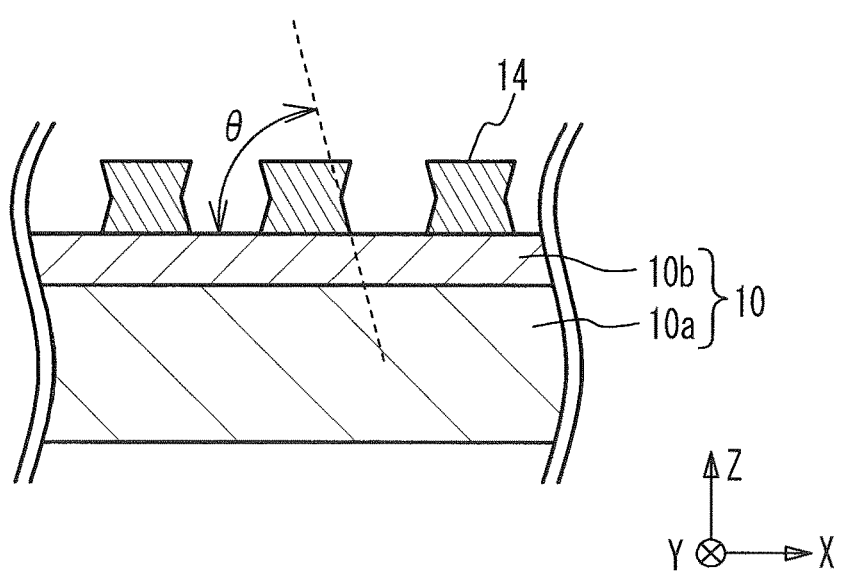

FIG. 8A through FIG. 8C are cross-sectional views of an acoustic wave resonator in accordance with a third embodiment. As illustrated in FIG. 8A, the side surface of the electrode finger 14 is inclined with respect to the upper surface of the substrate 10. The inner angle θ between the side surface and the lower surface of the electrode finger 14 is less than 90°. As illustrated in FIG. 8B, the upper side surface of the electrode finger 14 is substantially perpendicular to the upper surface of the substrate 10. As illustrated in FIG. 8C, the upper side surface of the electrode finger 14 is inclined so as to have an inverse tapered shape. In FIG. 8A and FIG. 8C, the inner angle θ between the side surface and the lower surface in the region in which the electrode finger 14 is in contact with the upper surface of the substrate 10 is less than 90°. Other structures are the same as those of the first and second embodiments, and the description thereof is thus omitted.

In the third embodiment, the inner angle θ is less than 90°. This configuration makes the area of the region in which the electrode finger 14 is in contact with the substrate 10 large. In addition, the stress concentration to the edge portion of the lower surface of the electrode finger 14 is reduced. Therefore, peeling of the electrode finger 14 is reduced. The inner angle θ is preferably 80° or less, more preferably 70° or less. The inner angle θ is preferably 45° or greater. The inner angle of the additional film 30 of the second embodiment may be made to be less than 90°.

First Variation of the Third Embodiment

Figure 9:
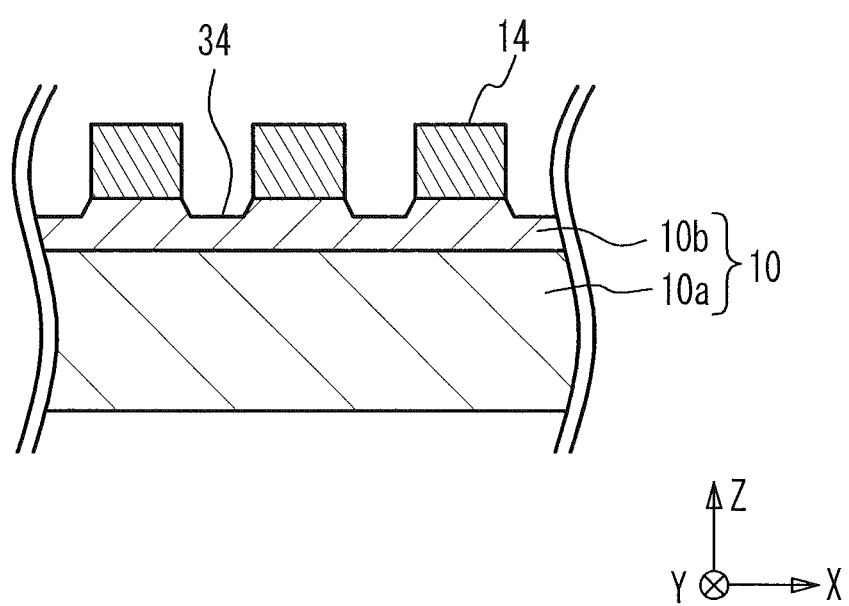
FIG. 9 is a cross-sectional view of an acoustic wave resonator in accordance with a first variation of the third embodiment.

FIG. 9 is a cross-sectional view of an acoustic wave resonator in accordance with a first variation of the third embodiment. As illustrated in FIG. 9, recessed portions 34 are formed on the upper surface of the piezoelectric substrate 10b other than the electrode fingers 14. The recessed portions 34 are formed by dry etching or ion milling the piezoelectric substrate 10b using the electrode fingers 14 as a mask. The depth of the recessed portion 34 is, for example, approximately 1 μm. Other structures are the same as those of the first and second embodiments, and the description thereof is thus omitted.

In the first variation of the third embodiment, the edge portion of the lower surface of the electrode finger 14 is substantially aligned with the edge portion of the recessed portion 34. This structure reduces the concentration of stress to the edge portion of the electrode finger 14. Therefore, peeling of the electrode finger 14 is reduced. The recessed portions 34 may be formed between the additional film 30 and the electrode fingers 14 in the second embodiment.

Figure 10:
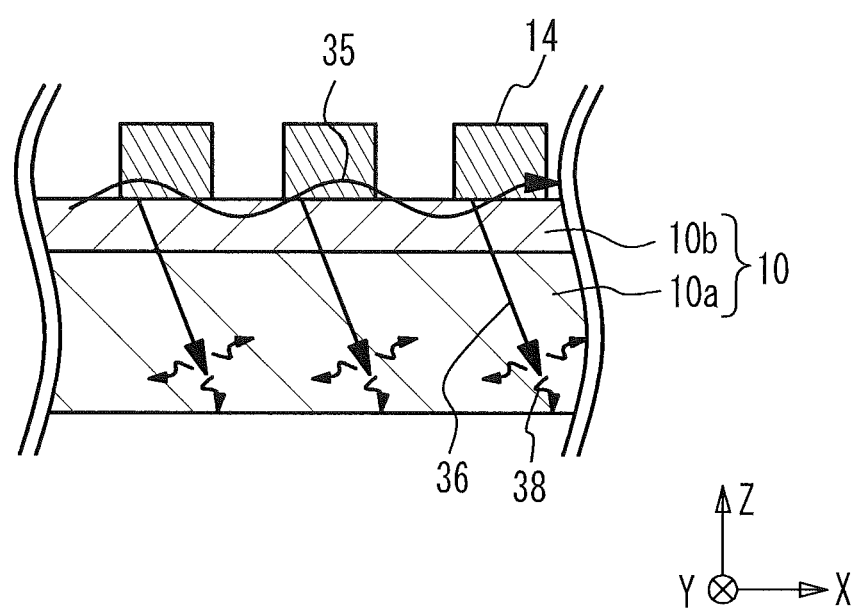
FIG. 10 is a cross-sectional view of an acoustic wave resonator.

FIG. 10 is a cross-sectional view of an acoustic wave resonator. As illustrated in FIG. 10, the electrode finger 14 excites a surface acoustic wave 35 on the piezoelectric substrate 10b. When the acoustic velocity at the operation frequency of the surface acoustic wave is greater than the acoustic velocity at the operation frequency of a lateral bulk wave 36 of the piezoelectric substrate 10b, the bulk wave 36 is emitted from the electrode finger 14 into the substrate 10. The emission of the bulk wave 36 becomes energy loss. In addition, the bulk wave 36 is consumed as thermal energy 38 in the support substrate 10a. Accordingly, the temperature of the acoustic wave resonator may increase, thereby deteriorating the reliability of the acoustic wave resonator.

The acoustic velocity of the surface acoustic wave 35 is preferably less than the acoustic velocity of the bulk wave 36. To make the acoustic velocity of the surface acoustic wave 35 slow, the electrode finger 14 is preferably made to be heavy. The densities of, for example, Ru, Rh, Pt, Mo, and W are greater than those of Al and Cu. Thus, in the first through third embodiments and the variations thereof, the metal film 12 is preferably mainly composed of at least one of Ru, Rh, Pt, Mo, and W.

Fourth Embodiment

Figure 11A:
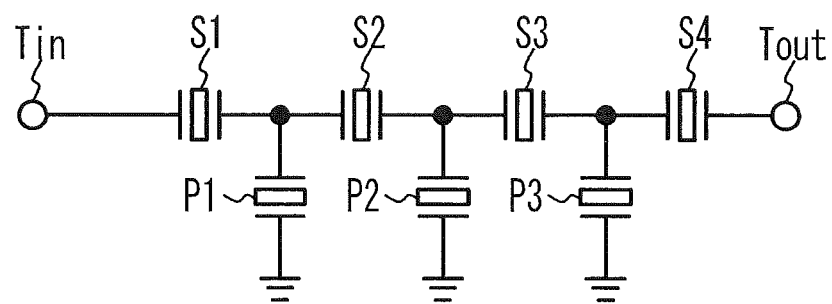
FIG. 11A is a circuit diagram of a filter in accordance with a fourth embodiment.

A fourth embodiment is an exemplary filter and an exemplary duplexer including the acoustic wave resonator according to any one of the first through third embodiments and the variations thereof. FIG. 11A is a circuit diagram of a filter in accordance with the fourth embodiment. As illustrated in FIG. 11A, between an input terminal Tin and an output terminal Tout, one or more series resonators S1 through S4 are connected in series. Between the input terminal Tin and the output terminal Tout, one or more parallel resonators P1 through P3 are connected in parallel. At least one of the one or more series resonators S1 through S4 and the one or more parallel resonators P1 through P3 may be the acoustic wave resonator according to any one of the first through third embodiments and the variations thereof. The number of series resonators and parallel resonators in the ladder-type filter may be freely selected. The filter including the acoustic wave resonator according to any one of the first through third embodiments and the variations thereof may be a multimode filter instead of the ladder-type filter.

Figure 11B:
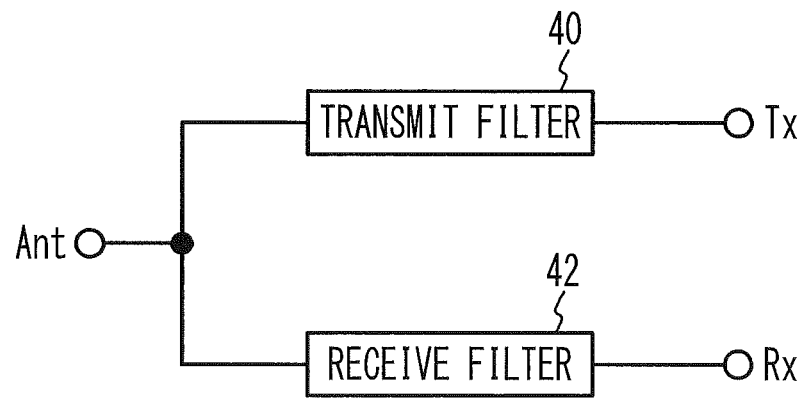
FIG. 11B is a circuit diagram of a duplexer in accordance with a first variation of the fourth embodiment.

FIG. 11B is a circuit diagram of a duplexer in accordance with a first variation of the fourth embodiment. As illustrated in FIG. 11B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the fourth embodiment. A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave resonator comprising:
    a piezoelectric substrate that is a lithium tantalate substrate or a lithium niobate substrate and has a thickness of 20 μm or less;
    a support substrate that has an upper surface bonded with a lower surface of the piezoelectric substrate and is a glass substrate mainly composed of silicon oxide;
    a plurality of electrode fingers that are located on an upper surface of the piezoelectric substrate, excite an acoustic wave, and include a metal film mainly composed of at least one of Cr, Mo, and W,
    wherein a thickness of the metal film is equal to or greater than 0.1 times a wavelength of the acoustic wave and is equal to or less than 0.2 times the wavelength of the acoustic wave.

2. The acoustic wave resonator according to claim 1, wherein
    the metal film is in contact with the piezoelectric substrate.

3. The acoustic wave resonator according to claim 1, wherein
    the plurality of electrode fingers are arranged in an X-axis orientation of the piezoelectric substrate.

4. The acoustic wave resonator according to claim 1, wherein the metal film mainly composed of Mo.

5. The acoustic wave resonator according to claim 1, wherein the thickness of the piezoelectric substrate is equal to or greater than 2 μm.

6. An acoustic wave resonator comprising:
    a piezoelectric substrate that is a lithium Tantalate substrate or a lithium Niobate substrate and has a thickness of 20 μm or less;
    a support substrate that has an upper surface bonded with a lower surface of the piezoelectric substrate and has a linear thermal expansion coefficient less than a linear thermal expansion coefficient in an X-axis orientation of the piezoelectric substrate; and
    a plurality of electrode fingers that are located on an upper surface of the piezoelectric substrate, are arranged in the X-axis orientation, excite an acoustic wave, and include a metal film having a thickness equal to or greater than 0.1 times and is equal to less than 0.2 times a wavelength of the acoustic wave and having a linear thermal expansion coefficient less than the linear thermal expansion coefficient in the X-axis orientation of the piezoelectric substrate, and
    the metal film is mainly composed of at least one of Ru, Rh, Pt, Ti, Cr, Mo, and W.

7. The acoustic wave resonator according to claim 6, wherein
    the support substrate is a sapphire substrate, a crystallized silicon oxide substrate, or a glass substrate mainly composed of silicon oxide.

8. The acoustic wave resonator according to claim 6, wherein
    the support substrate is a sapphire substrate, a crystallized silicon oxide substrate, or a glass substrate mainly composed of silicon oxide, and
    the metal film has a linear thermal expansion coefficient of 12 ppm/° C. or less.

9. The acoustic wave resonator according to claim 6, wherein the metal film mainly composed of at least one of Mo, Ru and Rh.

10. The acoustic wave resonator according to claim 6, wherein the thickness of the piezoelectric substrate is equal to or greater than 2 μm.

11. The acoustic wave resonator according to claim 6, wherein
    the metal film is in contact with the piezoelectric substrate.

12. An acoustic wave resonator comprising:
    a piezoelectric substrate that is a lithium tantalate substrate or a lithium niobate substrate and has a thickness of 20 μm or less;
    a support substrate that has an upper surface bonded with a lower surface of the piezoelectric substrate and is a sapphire substrate or a crystallized silicon oxide substrate; and
    a plurality of electrode fingers that are located on an upper surface of the piezoelectric substrate, excite an acoustic wave, and include a metal film mainly composed of at least one of Ru, Rh, Pt, and Ti,
    wherein a thickness of the metal film is equal to or greater than 0.1 times a wavelength of the acoustic wave and is equal to or less than 0.2 times the wavelength of the acoustic wave.

13. The acoustic wave resonator according to claim 12, wherein the metal film mainly composed of at least one of Ru and Rh.

14. The acoustic wave resonator according to claim 12, wherein
    the plurality of electrode fingers are arranged in an X-axis orientation of the piezoelectric substrate.

15. The acoustic wave resonator according to claim 12, wherein the thickness of the piezoelectric substrate is equal to or greater than 2 μm.

16. The acoustic wave resonator according to claim 12, wherein
    the metal film is in contact with the piezoelectric substrate.

17. An acoustic wave resonator comprising:
    a piezoelectric substrate;
    a support substrate that has an upper surface bonded with a lower surface of the piezoelectric substrate and has a linear thermal expansion coefficient less than a linear thermal expansion coefficient of the piezoelectric substrate;
    a pair of comb-shaped electrodes that is formed on the piezoelectric substrate and includes a first metal film with a linear thermal expansion coefficient less than the linear thermal expansion coefficient of the piezoelectric substrate, each of the pair of comb-shaped electrodes having a plurality of electrode fingers exciting an acoustic wave and a bus bar connecting the plurality of electrode fingers; and
    an additional film that is located on an upper surface of the piezoelectric substrate in a gap region, is not connected to the pair of comb-shaped electrodes, and includes a second metal film having a linear thermal expansion coefficient less than the linear thermal expansion coefficient of the piezoelectric substrate, the gap region being located between the plurality of electrode fingers of one of the pair of comb-shaped electrodes and the bus bar of the other of the pair of comb-shaped electrodes.

18. The acoustic wave resonator according to claim 17, wherein
the first metal film and the second metal film are made of a same material.

19. The acoustic wave resonator according to claim 17, wherein
the piezoelectric substrate is a lithium tantalate substrate with a film thickness of 20 μm or less or a lithium niobate substrate with a film thickness of 20 μm or less,
the support substrate is a sapphire substrate, a crystallized silicon oxide substrate, or a glass substrate mainly composed of silicon oxide,
the plurality of electrode fingers are arranged in an X-axis orientation of the piezoelectric substrate, and
the first metal film and the second metal film have linear thermal expansion coefficients of 12 ppm/° C. or less.

20. A filter comprising:
the acoustic wave resonator according to claim 17.

* * * * *